United States Patent
Krueger

(10) Patent No.: US 7,454,720 B2
(45) Date of Patent: Nov. 18, 2008

(54) METHOD FOR OPTIMIZING A LAYOUT OF SUPPLY LINES

(75) Inventor: Thomas Krueger, Munich (DE)

(73) Assignee: Infineon Technologies AG, Munich (DE)

( * ) Notice: Subject to any disclaimer, the term of this patent is extended or adjusted under 35 U.S.C. 154(b) by 338 days.

(21) Appl. No.: 11/060,220

(22) Filed: Feb. 16, 2005

(65) Prior Publication Data
US 2005/0180251 A1    Aug. 18, 2005

(30) Foreign Application Priority Data
Feb. 17, 2004    (DE) ................ 10 2004 007661

(51) Int. Cl.
*G06F 17/50* (2006.01)

(52) U.S. Cl. ................ 716/2; 716/11; 716/12; 716/13

(58) Field of Classification Search ............ 716/1–2, 716/9–15
See application file for complete search history.

(56) References Cited

U.S. PATENT DOCUMENTS

| | | | | |
|---|---|---|---|---|
| 5,687,108 | A * | 11/1997 | Proebsting | 365/51 |
| 6,317,353 | B1 * | 11/2001 | Ikeda et al. | 365/63 |
| 2001/0011362 | A1 | 8/2001 | Yoshinaga | |
| 2002/0024148 | A1 | 2/2002 | Itoh | |
| 2004/0107411 | A1 * | 6/2004 | Saxena et al. | 716/13 |
| 2006/0095872 | A1 * | 5/2006 | McElvain et al. | 716/1 |

* cited by examiner

*Primary Examiner*—Paul Dinh
(74) *Attorney, Agent, or Firm*—Brinks Hofer Gilson & Lione

(57) ABSTRACT

A method for optimizing a circuit layout is provided which optimizes a circuit layout as a result of utilizing unused tracks of the circuit layout to expand supply lines. In a first step, a circuit layout is constructed by means of any circuit layout construction method, whereby requirements regarding the design of supply lines are reduced. Subsequently, in a second step, the method for optimizing a circuit layout is used.

14 Claims, 7 Drawing Sheets

METHOD FOR OPTIMIZING A LAYOUT OF SUPPLY LINES

PRIORITY

This application claims the benefit of priority to German Patent Application 10 2004 007661.8, filed on Feb. 17, 2004, herein incorporated by reference in its entirety.

TECHNICAL FIELD

The present application relates to a method for optimizing circuit layouts concerning a layout of supply lines, as used in particular for microelectronic semiconductor circuits, and a device designed to implement the method.

BACKGROUND

With today's methods for the circuit layout, supply lines are routed in a first step. That is to say the supply lines are routed before any signal line is routed. Requirements regarding a layout of the supply lines as for example a maximum tolerable voltage drop, are guaranteed as the result of a sufficient number of tracks being assigned to the supply lines. A track is defined as a section of the circuit layout, on which a line (supply line or signal line) can be placed.

According to prior art methods for circuit layout, unused tracks (tracks that are not needed for constructing the circuit layout) are not employed any further. Since the unused tracks cannot be removed later from the circuit layout, in order thereby to reduce, for example, the space required by the circuit layout, expedient utilization of the unused tracks does not entail disadvantages. Since, on the other hand, expansion of the supply lines permits the supply lines to better withstand a voltage drop, a circuit layout in which the unused tracks are utilized to expand the supply lines possesses a not insignificant advantage compared to a circuit layout in which the unused tracks are not utilized. A circuit which better withstands a supply voltage drop can be operated at a higher clock frequency than a circuit in which the supply voltage drops with certain applications to a just tolerable minimum.

BRIEF SUMMARY

A method for optimizing a circuit layout is provided in which the circuit layout is optimized with regard to supply lines as a result of utilizing unused tracks of the circuit layout to expand the supply lines.

In order to optimize the circuit layout, the method can place a line on an unused track and connect this line to a supply line, as a result of which this line then becomes part of the supply line. With circuit layouts which comprise several line layers lying parallel one above the other, a line placed on an unused track can also be connected over a via to a supply line existing in a parallel-lying line layer, as a result of which this line then becomes part of the supply line. Since the supply lines are expanded and/or extended by a connection to lines placed on unused tracks, lines also placed on unused tracks can be connected to the supply lines, which at the beginning of the method could not be connected directly to one of the supply lines.

With the method, an unused track that lies in the proximity of a time-critical signal line is preferably not used to expand the supply lines. In this case, a time-critical signal line is a line over which a signal is transmitted, the propagation speed of which over the line may not be below a certain threshold. Or in other words, a time interval that is needed to transmit a change in level of the signal over the line may not be longer than a pre-determined time interval.

In order to specify the time-critical signal lines of a circuit, there are several possibilities. For example, signal lines of a circuit can be classified as time-critical, where an extension of the time interval needed under normal circumstances to transmit the change in level of the signal over the line by a pre-determined value would lead to failure of the circuit. As a supply line negatively affects and/or slows down transmission of the change in level through induction for example, supply lines should not lie too close to time-critical signal lines.

When a supply line lies too close to a time-critical signal line, the width of a standardized track can be used for the specification. For example, a supply line is only placed next to a time-critical line if at least a distance which is computed from the product of a pre-determined factor and the width of the standardized track exists between the supply line and the time-critical line. A supply line is not placed on an unused track that crosses a time-critical signal line.

Crossing of the supply line and the time-critical signal line is present, if the supply line lies in a first line layer and the time-critical line lies in a second line layer lying directly above or below the first line layer, whereby tracks running in the first line layer are aligned perpendicularly opposite the tracks running in the second line layer, and if the supply line would intersect the time-critical line had the first line layer and the second line layer been brought together. Since any crossing of the supply line and the time-critical line can negatively affect the time response of a signal transmission on the time-critical signal line, it is expedient under particular circumstances to prevent the supply line and the time-critical line from crossing.

Two or more parallel-running adjacent tracks may be combined to form a new unused track, whereby a line that is connected to one of the supply lines can be placed on the new unused track. In addition, a supply line that runs parallel and adjacent to an unused track can be expanded by a line placed on this unused track. In this case, the distance of a supply line which is placed on a track consisting of several parallel-running adjacent tracks (that is to say the track on which the supply line is placed is several times wider than a standardized track), to a next adjacent track is exactly as great as the distance of a supply line placed on a standardized track from a next adjacent track. That is to say the distance does not increase with the width of the supply line.

Supply lines carrying two different potentials can be extended such that the two supply lines in each case will be expanded with two parallel-running lines, which are placed on parallel-running unused tracks.

It is expedient to expand the two supply lines if possible to the same extent. As the two supply lines are expanded by two parallel-running lines, which are usually the same length, whereby the one of the two supply lines is expanded by the one of the two lines and the other one of the two supply lines by the other one of the two lines, uniform expansion of the supply lines is ensured.

A method for constructing a circuit layout is also proposed in which a circuit layout is constructed in a first step by means of any circuit layout construction method. Requirements regarding a design of a part of the circuit layout concerning the supply lines are reduced by a pre-determined percentage compared to the normal specifications for the circuit layout construction method. The circuit layout is then optimized as a second and/or final step.

As the requirements regarding the circuit layout construction method are reduced, the present circuit layout construction method can result in a more compact circuit layout than if the circuit layout construction method were to operate with its normal specifications and/or requirements. This may not lead to any disadvantages because the optimizing method is used in the second step, which makes up for the inadequacies of the circuit layout constructed by the known circuit layout construction method caused by the reduced requirements. In other words, the present method for constructing the circuit layout is able to deliver a more compact circuit layout than known available circuit layout construction methods.

In this case, the certain percentage can correspond to a percentage at which the optimizing method described above at least improves the design of the part of the circuit layout concerning the supply lines. As the result of the percentage being selected as described above, the characteristics of a circuit layout which has been constructed by the present method are guaranteed to be at least as good as the characteristics of a circuit layout which has been constructed by a circuit layout construction method used in the first step of the present method and the circuit layout is more compact.

The present invention is suitable for a method or a device with which circuit layouts for microelectronic semiconductor circuits are optimized and/or constructed. Of course, the invention however is not limited to this since it can also be used, for example to optimize or manufacture circuit layouts for boards. Furthermore, the invention also comprises a data medium or a computer program product with a computer program, which implements the method in accordance with the invention when used in a data processor or computer system.

The foregoing summary has been provided only by way of introduction. Nothing in this section should be taken as a limitation on the following claims, which define the scope of the invention.

BRIEF DESCRIPTION OF THE DRAWINGS

The present invention is described below in detail with reference to the appended drawing on the basis of a preferred embodiment.

DETAILED DESCRIPTION OF THE PREFERRED EMBODIMENTS

Figure 1:
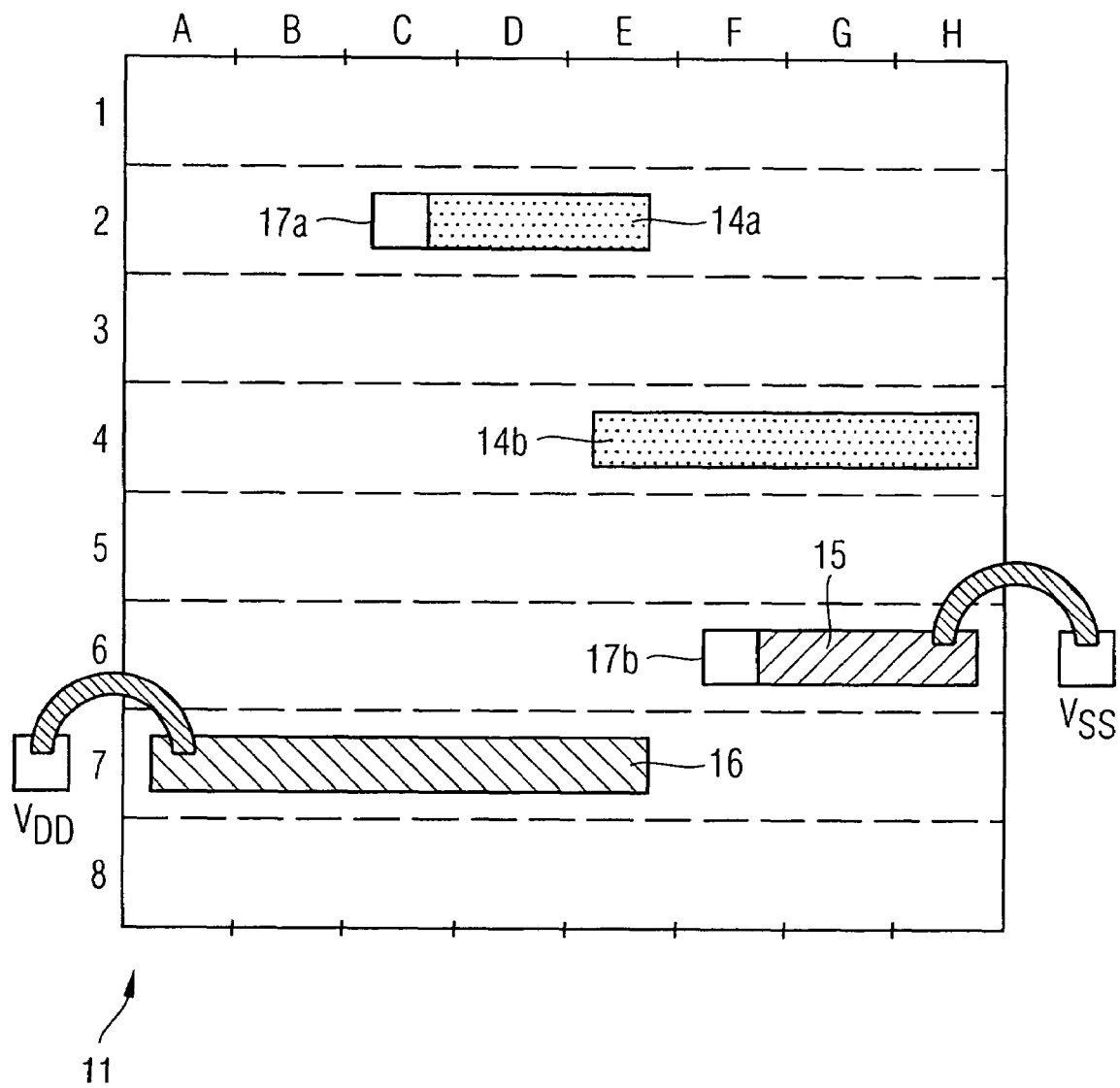
FIG. 1 represents a first line layer of a circuit layout of a microelectronic semiconductor circuit.

FIG. 1 illustrates a first line layer 11 of a circuit layout for a semiconductor used in a microelectronic device. This circuit layout has been constructed in a first step of a method for constructing a circuit layout with a conventional circuit layout construction method. In FIG. 1, the horizontal letters A-H at the top as well as the vertical numbers 1-8 on the left constitute a coordinate system. This coordinate system is also present in FIGS. 2-6. A first signal line 14a is placed on a track running from C2 to E2 and a second signal line 14b on a track running from E4 to H4. In this case the first signal line 14a is connected by means of a first via 17a to a second line layer 12, shown in FIG. 2. Further below, a first part of a first supply line 15 is placed on a track running from F6 to H6, which lies on a potential VSS. This first part of the first supply line 15 is also connected over a second via 17b to the second line layer 12. In addition, a second supply line 16 is placed on a track running from A7 to E7, which lies on a potential VDD.

Figure 2:
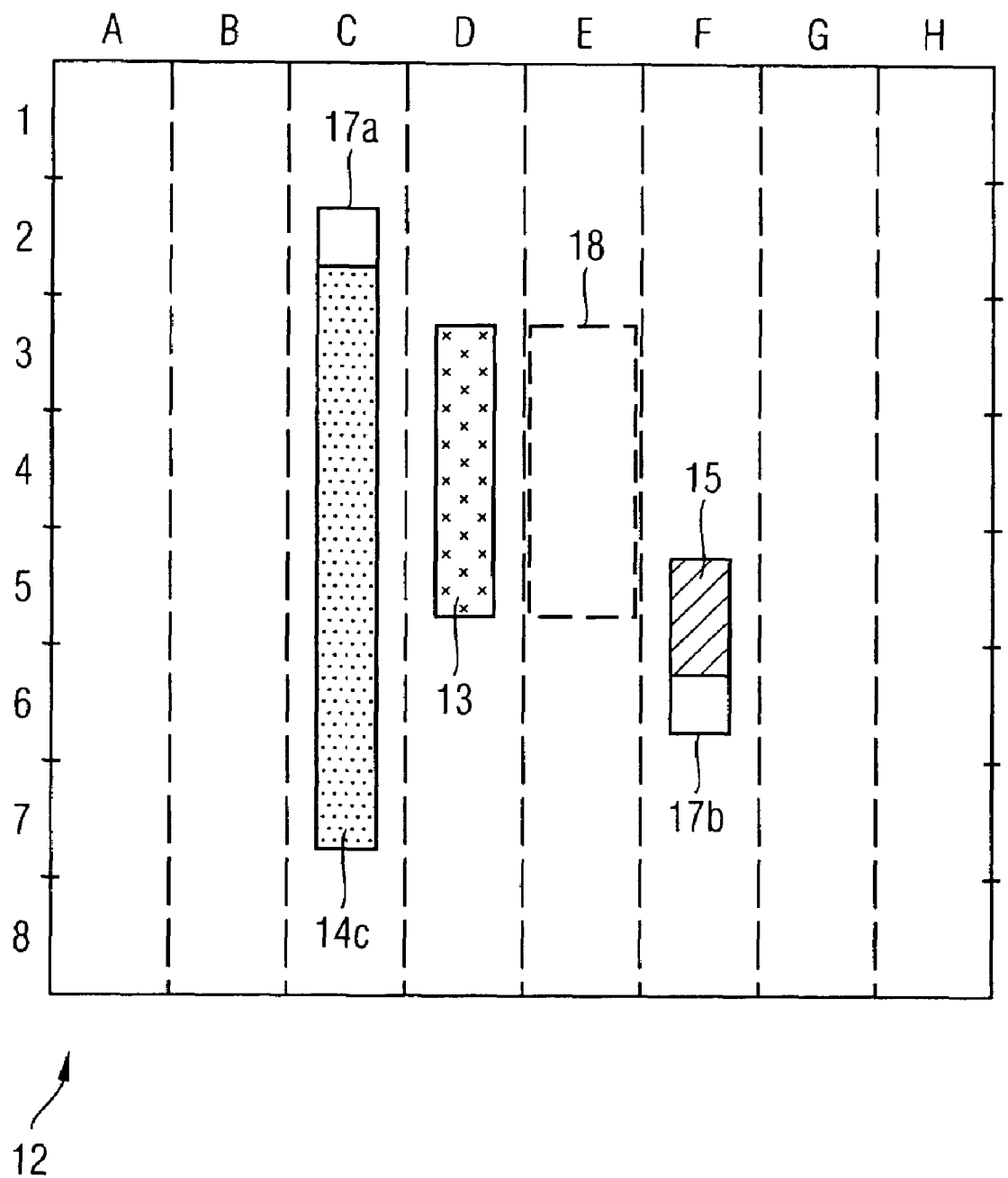
FIG. 2 represents a second line layer of the circuit layout, from which the first line layer is shown in FIG. 1.

In the second line layer 12, illustrated in FIG. 2, a third signal line 14c is placed on a track running from C2 to C7, which is connected over the first via 17a to the first signal line 14a. Running parallel and adjacent thereto, a time-critical signal line 13 is placed on a track running from D3 to D5. On the right, running parallel and adjacent to this time-critical signal line 13, an unused track 18, which runs from E3 to E5, is drawn in by way of example. Finally, on a track running from F5 to F6, a second part of the first supply line 15 is drawn in, which is connected to the first part over the second via 17b.

It should be pointed out that the circuit layout represented in FIGS. 1 and 2 is shown by way of example and serves a more graphic purpose than has practical relevance. Therefore a portion of unused tracks is even substantially greater than 50% in the case of the circuit layout illustrated. On the other hand, the portion of unused tracks is between 20% and 50% in the case of circuit layouts used in practice.

In a second step of the method for constructing a circuit layout, the circuit layout illustrated in FIG. 1 and FIG. 2 is now optimized by means of a method for optimizing a circuit layout.

Initially, the first supply line 15 in the first line layer 11 is extended by an unused track running from A6 to E6. Similarly the second supply line 16 is extended by an unused track running from F7 to H7. In order to place an extension of the second supply line 16 also on unused tracks in the second line layer 12, a third via 17c is inserted in the case of A7 and a fourth via 17d in the case of H7, which both connect the second supply line 16 to the second line layer 12. The result is shown in FIG. 3.

Figure 4:
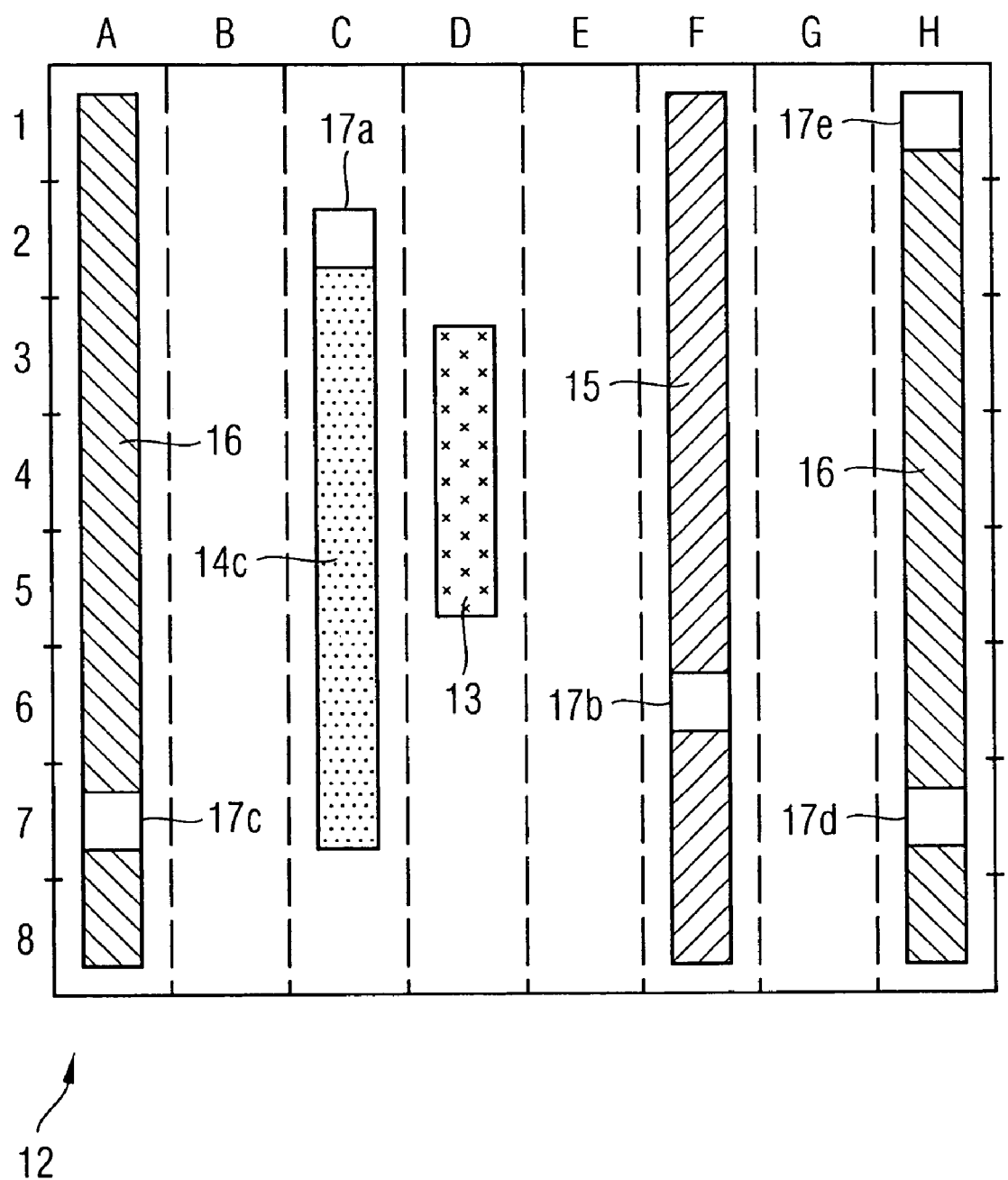
FIG. 4 represents the intermediate state of optimization according to the invention of the circuit layout, whereby the second line layer is illustrated.

In the second line layer 12, the first supply line 15 is extended such that it is now placed on a track running from F1 to F8. The second supply line 16, which over the third via 17c and fourth via 17d now has contact with the second line layer 12, is extended by means of tracks running from A1 to A8 and H1 to H8. The result is shown in FIG. 4.

Figure 3:
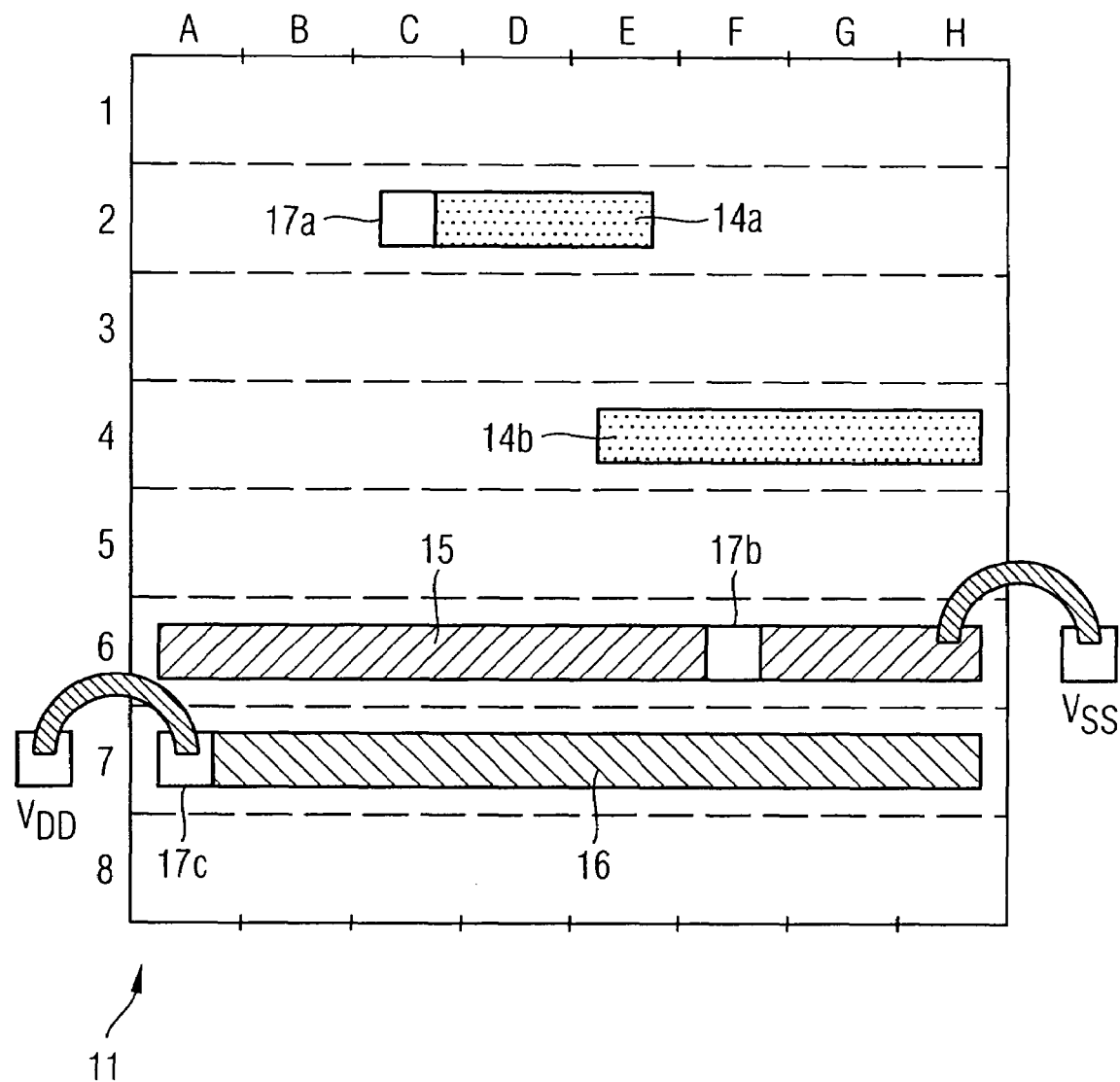
FIG. 3 represents an intermediate state of optimization according to the invention of the circuit layout, whereby the first line layer is illustrated.
Figure 5:
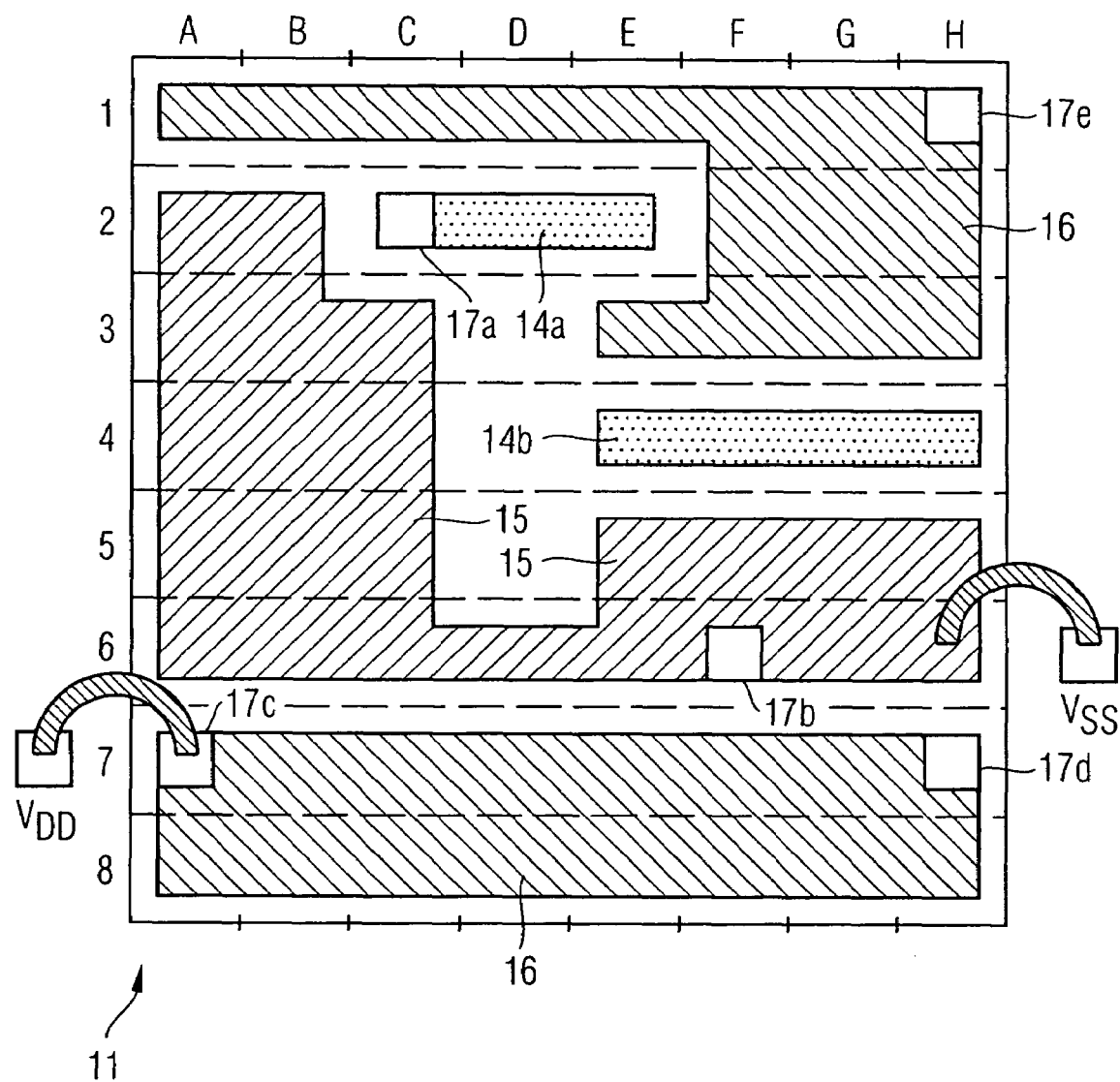
FIG. 5 represents the first line layer after optimization according to the invention of the circuit layout.

Starting from the state illustrated in FIG. 3, the layout of the first line layer 11 is now further optimized concerning the supply lines 15, 16, whereby a final state of optimization of the circuit layout concerning the first line layer 11 is illustrated in FIG. 5. For this purpose, the supply line is expanded by a track running from A8 to H8, which corresponding to the state illustrated in FIG. 3 runs parallel and adjacent to the second supply line 16. As shown in FIG. 5, the second supply line 16 is placed completely on the track, which runs from A8 to H8 and an edge or safety gap lying inside the track running from A8 to H8 is impinged by the second supply line 16. That is to say, as the result of placing one of the supply lines 15, 16 on two parallel-running adjacent tracks, the supply line assumes a greater surface than if the supply line had been placed on two equally long, but not parallel-running tracks. Since with otherwise similar pre-conditions for a circuit a supply line, which possesses a greater surface, is less susceptible to voltage drop, a supply line with a greater surface possesses advantages.

As likewise shown in FIG. 5, the second supply line 16 has been placed on a track running from A1 to H1, which is connected over the fifth via 17e to the part of the second supply line 16 present in the second line layer 12. Additionally, the second supply line 16 has also been extended with tracks running from F2 to H2 and from E3 to H3, which run parallel and adjacent. The second supply line 16 does not run through the coordinate point D3 because the time-critical signal line 13 runs over this coordinate point in the second line layer 12. This means that the second supply line 16 is prevented from crossing the time-critical signal line 13.

As likewise shown in FIG. 5, the first supply line 15 is extended by several tracks, which all run (starting from the state shown in FIG. 3) above the first supply line 15. In this case, the first supply line 15 does not cross the time-critical signal line 13, for which reason a section running from D3 to D5 is left blank in the first line layer 11.

Figure 6:
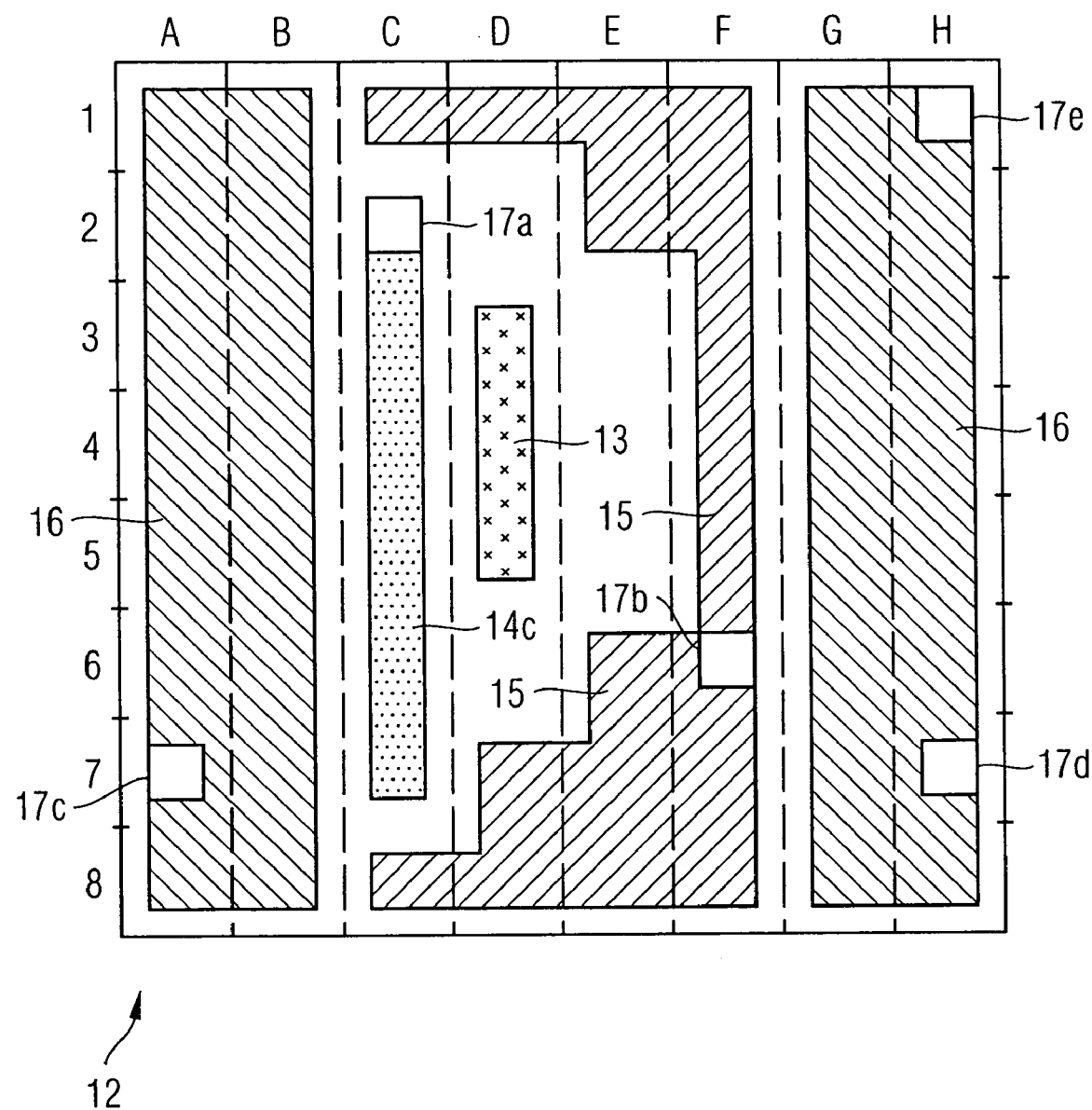
FIG. 6 represents the second line layer after optimization according to the invention of the circuit layout.

A final state of optimization concerning the second line layer 12 of the circuit layout is shown in FIG. 6. Starting from the state shown in FIG. 4, the second supply line 16 on the left has been extended by a track running from B1 to B8 and on the right by a track running from G1 to G8. The first supply line 15 is extended by several smaller unused tracks, as shown in FIG. 6. In this case, a track running from E3 to E5 is not used to extend the first supply line 15, because it runs parallel and adjacent to the time-critical signal line 13. For the same reason, the coordinate points D2 and D6 are also left blank.

Since, as already mentioned above, the portion of the unused tracks in the circuit layout shown in FIGS. 1 and 2 for graphic and technical description-related reasons, is greater than in the case of practically relevant circuit layouts, the portion of the supply lines 15, 16 in the case of the optimized circuit layout shown in FIGS. 5 and 6 is also greater than in the case of optimized practically relevant circuit layouts.

If the circuit layout shown in FIGS. 1 and 2, which in the first step of the method for constructing a circuit layout has been constructed by a conventional circuit layout construction method, is compared with the circuit layout illustrated in FIGS. 5 and 6, which has finally been manufactured by the method for constructing a circuit layout, as a result of the circuit layout constructed in the first step having been optimized by the method for optimizing a circuit layout, it is found that the supply lines 15, 16 assume a substantially greater surface. Thus, the risk of a voltage drop with an optimized circuit constructed according to the circuit layout illustrated in FIGS. 5 and 6 is substantially less than in the case of a non-optimized circuit layout constructed according to the circuit layout illustrated in FIGS. 1 and 2. Therefore, the optimized circuit can be operated, for example, at a higher clock frequency than the non-optimized circuit.

The embodiment shown in FIGS. 1 to 6 was extended with the supply lines 15, 16. For certain applications however, it is also advantageous to utilize the unused tracks in order to extend only one supply line, in particular that connected to ground, which is naturally also possible with the afore-described methods.

Figure 7:
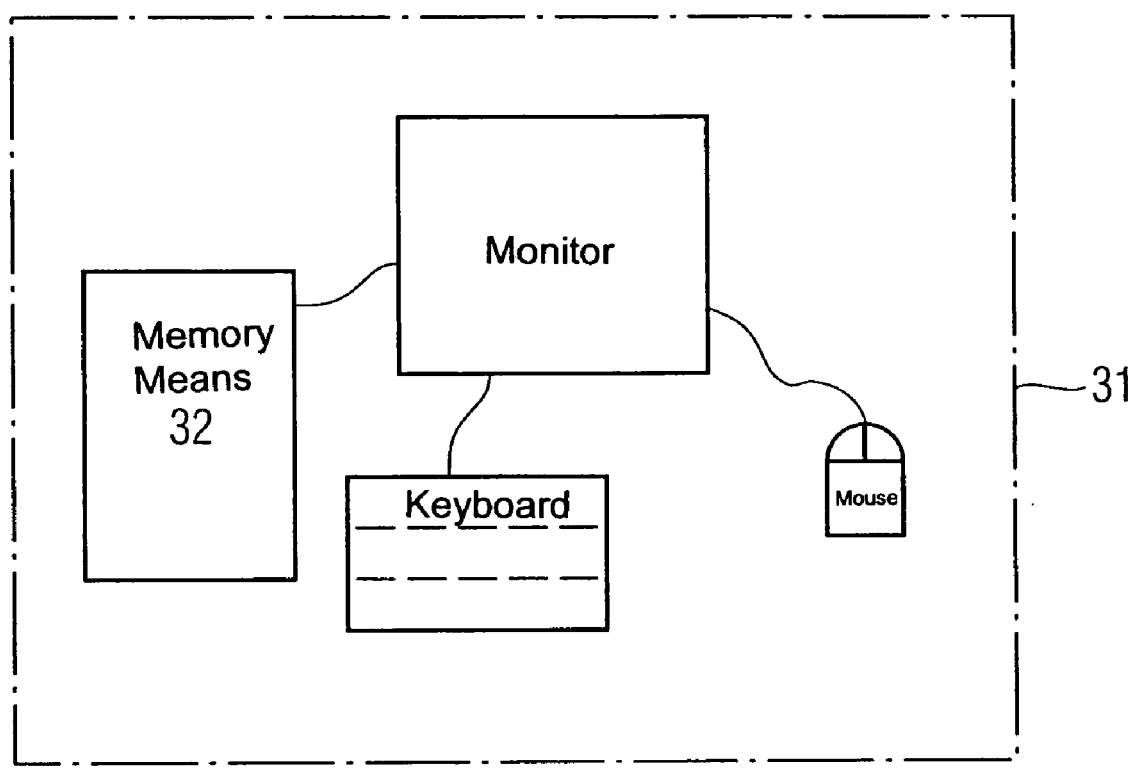
FIG. 7 represents a computer system, on which the methods in accordance with the invention can be implemented.

A computer system 31 is illustrated in FIG. 7, which apart from a keyboard, monitor and mouse comprises memory means 32 (main memory and hard disk, as well as replaceable memory media) as well as a microprocessor. In this case the specifications and information necessary for constructing a circuit layout as well as a computer program provided for executing the afore-described methods are stored in the memory means 32, whereby they are entered in the computer system for example by means of the mouse and keyboard. This computer system 31 executes the afore-described methods for constructing a circuit layout and for optimizing a circuit layout, in an automated and software-controlled way by accessing the information and/or description stored in the memory means 32.

Methods for circuit layout construction or methods related thereto for the mask production need all the more computer system resources (storage space, running time), the more tracks that are used for the circuit layout. Since the method for optimizing a circuit layout adds further tracks to extend the supply lines, a computer system which is designed too small can be pushed to its limits. In this case, it is expedient not to optimize the entire circuit layout and/or the entire circuit, but only one layout of circuit sections, although optimization of the full circuit layout delivers the best results.

The method for optimizing a circuit layout was applied to six layouts of circuit sections, whereby the layouts were originally constructed by a Place&Route Tool from Magma DA. The method was implemented as a routine of this Place&Route Tool, whereby for simplification a safety margin of 1 micron to all parallel signal lines (not only the time-critical) was used, in order not to negatively affect the time response of the circuit. In Table 1, the six layouts are compared with one another, whereby from a quality aspect a reduction of a maximum voltage drop, which was determined by means of a Simulation Tool in each case before and after application of the method for optimizing a circuit layout for each of the six layouts was selected.

TABLE 1

| Circuit Section | Voltage drop beforehand | Voltage drop afterwards | Improvement |
|---|---|---|---|
| S1 | 40.1 mV | 31.3 mV | 22% |
| S2 | 121.8 mV | 90.3 mV | 26% |
| S3 | 66.0 mV | 63.3 mV | 6% |
| S4 | 257.3 mV | 215.6 mV | 16% |
| S5 | 189.5 mV | 132.2 mV | 30% |
| S6 | 15.3 mV | 14.3 mV | 7% |

The results of Table 1 show that the layout of the six circuit sections could be improved by 18% on average.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for optimizing a circuit layout containing a plurality of unused tracks and a plurality of supply lines, the method comprising:

providing a set of requirements to be fulfilled by the circuit layout, the set of requirements defining a maximum voltage drop of the supply lines during operation of a circuit constructed according to the circuit layout;

reducing the set of requirements with respect to the maximum voltage drop of the supply lines and with respect to a design of a section of the circuit layout concerning the supply lines and constructing the circuit layout in which the supply lines follow the reduced set of requirements; and optimizing the circuit layout by expanding the layout of the supply lines of the circuit layout using the unused tracks.

2. The method according to claim 1, further comprising combining a plurality of parallel-running adjacent sections of unused tracks to form a new unused track, a width of the new unused track equal to a sum of widths of the combined parallel-running parts.

3. The method according to claim 1, further comprising connecting at least a section of an unused track that runs adjacent over a length parallel to a supply track on which one of the supply lines is arranged to form a new unused track if the section exists, the section connected over the length to the supply track.

4. The method according to claim 3, further comprising placing a supply line on the new unused track such that a distance of the supply line on the new unused track from a first track adjacent to the new unused track is equal to a distance of a supply line placed on the first track to a second track adjacent with the first track.

5. The method according to claim 1, wherein the supply lines comprise at least two supply lines that carry different potentials, and the method comprises expanding the supply lines that carry the different potentials such that each of the supply lines that carry the different potentials is expanded with two parallel running lines that are placed on parallel-running unused tracks.

6. The method according to claim 1, wherein the circuit layout is used for a microelectronic semiconductor circuit.

7. The method according to claim 1, wherein the supply lines are expanded by placing a first line on a first unused track and connecting the first line to one of the supply lines.

8. The method according to claim 7, wherein connecting the placed line and the one of the supply lines comprises placing a second line on a second unused track and joining the first line to the supply line using the second line.

9. The method according to claim 1, wherein the circuit layout comprises a plurality of parallel line layers lying one above the other, and the supply lines are expanded by placing a first line lying in a first line layer on a first unused track and connecting the first line, using a via, to at least one of:

a supply line lying in a second line layer; and a second line lying in the second line layer and placed on a second unused track.

10. The method according to claim 1, further comprising avoiding the use of an unused track that lies in the proximity of a time-critical signal line of the circuit layout to expand the supply lines.

11. The method according to claim 1, further comprising avoiding the use of an unused track that runs parallel to a time-critical signal line or crosses a time-critical signal line to expand the supply lines.

12. The method according to claim 1, further comprising selecting one of the supply lines and connecting all unused tracks to the selected supply line.

13. In a computer readable storage medium having stored therein instructions executable by a computer system for optimizing a circuit layout containing a plurality of unused tracks and a plurality of supply lines, the storage medium comprising instructions for:

providing a set of requirements to be fulfilled by the circuit layout, the set of requirements defining a maximum voltage drop of the supply lines during operation of a circuit constructed according to the circuit layout;

reducing the set of requirements with respect to the maximum voltage drop of the supply lines and with respect to a design of a section of the circuit layout concerning the supply lines and constructing the circuit layout in which the supply lines follow the reduced set of requirements; and optimizing the circuit layout by expanding the layout of the supply lines of the circuit layout using the unused tracks.

14. The computer readable storage medium according to claim 13, wherein the circuit layout is first constructed by means of a circuit layout construction method, requirements regarding a design of a section concerning supply lines of the circuit layout are reduced by at most a certain percentage, and then a layout of the supply lines is optimized using the unused tracks to expand the supply lines.

* * * * *